US010727856B2

(12) United States Patent
Wu et al.

(10) Patent No.: US 10,727,856 B2
(45) Date of Patent: Jul. 28, 2020

(54) SUCCESSIVE APPROXIMATION REGISTER ANALOG-TO-DIGITAL CONVERTER AND CONTROL CIRCUIT THEREOF

(71) Applicant: REALTEK SEMICONDUCTOR CORPORATION, Hsinchu (TW)

(72) Inventors: Cheng-Hui Wu, Kaohsiung (TW); Jie-Fan Lai, Hsinchu (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/519,472

(22) Filed: Jul. 23, 2019

(65) Prior Publication Data
US 2020/0091926 A1 Mar. 19, 2020

(30) Foreign Application Priority Data
Sep. 14, 2018 (TW) .............................. 107132379 A

(51) Int. Cl.
H03M 1/46 (2006.01)
(52) U.S. Cl.
CPC ........... H03M 1/462 (2013.01); H03M 1/466 (2013.01)
(58) Field of Classification Search
CPC ..... H03M 1/462; H03M 1/466; H03M 1/0624
USPC ................................................. 341/172, 155
See application file for complete search history.

(56) References Cited

U.S. PATENT DOCUMENTS 10,574,254 B2 * 2/2020 Lee ...................... H03M 1/447
10,623,010 B2 * 4/2020 Loke ................... H03L 7/0996
10,637,495 B2 * 4/2020 Shen ................... H03M 1/468

FOREIGN PATENT DOCUMENTS

TW 405253 9/2000

OTHER PUBLICATIONS

Chan, C. et al (2015). A 5.5mW 6b 5GS/S 4x-interleaved 3b/cycle SAR ADC in 65nm CMOS. Digest of Technical Papers—IEEE International Solid-State Circuits Conference. 58. 466-467. 10.1109/ISSCC.2015.7063128.
C. Liu et al., "A 10-bit 50-MS/s SAR ADC With a Monotonic Capacitor Switching Procedure," in IEEE Journal of Solid-State Circuits, vol. 45, No. 4, pp. 731-740, Apr. 2010. doi: 10.1109/JSSC.2010.2042254.

(Continued)

Primary Examiner — Brian K Young
(74) Attorney, Agent, or Firm — WPAT, PC

(57) ABSTRACT

This invention discloses a successive approximation register analog-to-digital converter (SAR ADC) and a control circuit thereof. The SAR ADC includes a comparator, a switched-capacitor digital-to-analog converter (DAC), and a control circuit. The switched-capacitor DAC includes a capacitor and a driving circuit that is electrically connected to the capacitor. The driving circuit comprises a P-type MOSFET and an N-type MOSFET, and the gates of the two MOSFETs are not electrically connected. The P-type MOSFET is controlled by a first control signal, and the N-type MOSFET is controlled by a second control signal. The control circuit controls the voltage at one end of the capacitor to switch from a high voltage level to a low voltage level by controlling the rising edge of the first control signal to lead the rising edge of the second control signal.

7 Claims, 10 Drawing Sheets

(56) References Cited

OTHER PUBLICATIONS

G. Huang et al., "A 10b 200MS/s 0.82mW SAR ADC in 40nm CMOS," 2013 IEEE Asian Solid-State Circuits Conference (A-SSCC), Singapore, 2013, pp. 289-292. doi: 10.1109/ASSCC.2013.6691039.
Ying-Zu Lin et al., "A 8.2-mW 10-b 1.6-Gs/s 4x TI SAR ADC with fast reference charge neutralization and background timing-skew calibration in 16-nm CMOS," 2016 IEEE Symposium on VLSI Circuits (VLSI-Circuits), Honolulu, HI, 2016, pp. 1-2. doi: 10.1109/VLSIC.2016.7573536.
Taiwan Intellectual Property Office, Office Action letter of counterpart TW application No. 107132379 dated Jan. 19, 2019. English summary on p. 1.

\* cited by examiner

US 10,727,856 B2

SUCCESSIVE APPROXIMATION REGISTER ANALOG-TO-DIGITAL CONVERTER AND CONTROL CIRCUIT THEREOF

BACKGROUND OF THE INVENTION

1. Field of the Invention

The present invention generally relates to a successive approximation register analog-to-digital converter (SAR ADC) and its control circuit.

2. Description of Related Art

In the following description, two ends of a capacitor are defined as a top plate and a bottom plate, respectively; the top plate refers to the end coupled to the comparator, whereas the bottom plate refers to the end not coupled to the comparator. Such definition is made only for the ease of discussion and not necessarily related to "top" and "bottom" in the actual circuit.

FIG. 1 is a functional block diagram of a conventional successive approximation register analog-to-digital converter (SAR ADC). The SAR ADC primarily includes a switched-capacitor digital-to-analog converter (DAC) 110, a comparator 120, a successive approximation register (SAR) 130, and a control circuit 140. The SAR ADC operates according to the clock CLK. In a certain operation of the SAR ADC, the SAR 130 determines a bit value (1/0) of one bit of the digital code D according to the comparison result of the comparator 120, and the control circuit 140 generates the control signal G according to the digital code D. The control signal G controls the terminal voltage of the capacitors in the switched-capacitor DAC 110 (i.e., controlling the bottom plate of the capacitors to be coupled to the reference voltage Vref1 or the reference voltage Vref2), so that the charges on the capacitors redistribute, leading to a change in the voltage at the inverting input or non-inverting input of the comparator 120. As a result, the voltage to be compared by the comparator 120 in the subsequent comparison operation change. The above steps are repeated to determine the digital code D bit by bit (from the most significant bit (MSB) to the least significant bit (LSB)); meanwhile, the value that the digital code D represents gradually approaches the input signal Vi.

FIG. 2 shows an internal circuit of the switched-capacitor DAC 110. The switched-capacitor DAC 110 includes two capacitor arrays, each of which includes n capacitors (C1 to Cn or C1' to Cn') and n switches (SW1 to SWn or SW1' to SWn') (n is a positive integer), meaning that the digital code D contains n+1 bits (D1 to Dn+1, D1 being the LSB and Dn+1 being the MSB), and the control signal G contains n sub-control signals G1 to Gn and n sub-control signals #G1 to #Gn. The sub-control signals G1 to Gn (or #G1 to #Gn) correspond to the bits D2 to Dn+1, respectively. The sub-control signal #Gk is an inversion of the sub-control signal Gk, and the switch SWk and the switch SWk' are controlled by the sub-control signals Gk and #Gk, respectively (k is an integer and 1≤k≤n). More specifically, when the switch SWk is switched to the reference voltage Vref1, the switch SWk' is switched to the reference voltage Vref2; when the switch SWk is switched to the reference voltage Vref2, the switch SWk' is switched to the reference voltage Vref1. FIG. 2 also shows that the input signal Vi is a differential signal, which is made up of the signals Vip and Vin, and the switch SWip and the switch SWin are utilized to sample the input signal Vi.

The control circuit 140 includes n sub-control circuits, and the n sub-control circuits respectively correspond to the switches SW1 to SWn (i.e., respectively corresponding to the capacitors C1 to Cn). FIG. 3 shows the connection between the sub-control circuit 305-$k$ and the switch SWk. The switch SWk is practically an inverter including a P-type metal-oxide-semiconductor field-effect transistor (MOSFET) Mp and an N-type MOSFET Mn. The switching state of the switch SWk indicates whether the P-type MOSFET Mp and the N-type MOSFET Mn are turned on or off. The sub-control circuit 305-$k$ includes a memory 310-$k$ and a buffer 320-$k$ and is configured to generate the sub-control signal Gk according to the bit Dk+1. The memory 310-$k$ stores the bit Dk+1, and the buffer 320-$k$, which usually includes a plurality of inverters connected in series, is utilized to boost the driving capability of the signal.

As the sub-control signal Gk makes a level transition from low to high or from high to low, the P-type MOSFET Mp and the N-type MOSFET Mn are simultaneously turned on in a short period of time, resulting in a short-circuit current generated between the reference voltage Vref1 and the reference voltage Vref2. The short-circuit current causes ripples on the reference voltage Vref1 and the reference voltage Vref2 and increases the current drawn from the reference voltage Vref1 (i.e., increases power consumption).

SUMMARY OF THE INVENTION

In view of the issues of the prior art, an object of the present invention is to provide a successive approximation register analog-to-digital converter (SAR ADC) and its control circuit, so as to make an improvement to the prior art.

A SAR ADC is provided. The SAR ADC includes a comparator, a switched-capacitor digital-to-analog converter (DAC), and a control circuit. The switched-capacitor DAC includes a capacitor and a driving circuit that is electrically connected to the capacitor. The driving circuit includes a P-type MOSFET and an N-type MOSFET. The P-type MOSFET has a first gate, a first source, and a first drain. The first gate receives a first control signal, the first source receives a first a reference voltage, and the first drain is electrically connected to a first end of the capacitor of the switched-capacitor DAC. A second end of the capacitor is coupled to an input end of the comparator. The N-type MOSFET has a second gate, a second source, and a second drain. The second gate receives a second control signal, the second source receives a second reference voltage, and the second drain is electrically connected to the first end of the capacitor. The control circuit controls a target voltage of the first end of the capacitor according to an output value of the comparator. The control circuit controls the target voltage to change from a high voltage level to a low voltage level by controlling a rising edge of the first control signal to lead a rising edge of the second control signal, or the control circuit controls the target voltage to change from the low voltage level to the high voltage level by controlling the falling edge of the second control signal to lead the falling edge of the first control signal.

A control circuit of a SAR ADC is also provided. The SAR ADC includes a comparator and a switched-capacitor DAC. The switched-capacitor DAC includes a capacitor and a driving circuit that is electrically connected to the capacitor. The driving circuit includes a first P-type MOSFET and a first N-type MOSFET, and a gate of the first P-type MOSFET is not electrically connected to a gate of the first N-type MOSFET. The control circuit includes a memory, a first inverter, and a second inverter. The memory is configured to store an output value of the comparator. The first inverter is coupled between the memory and the first P-type MOSFET and configured to generate a first control signal for controlling the first P-type MOSFET. The second inverter is coupled between the memory and the first N-type MOSFET and configured to generate a second control signal for controlling the first N-type MOSFET. The first inverter includes a second P-type MOSFET and a second N-type MOSFET. The second P-type MOSFET has a first aspect ratio, and the second N-type MOSFET has a second aspect ratio. The second inverter includes a third P-type MOSFET and a third N-type MOSFET. The third P-type MOSFET has a third aspect ratio, and the third N-type MOSFET has a fourth aspect ratio. The first aspect ratio is greater than the second aspect ratio and/or the third aspect ratio is smaller than the fourth aspect ratio.

A control circuit of a SAR ADC is also provided. The SAR ADC includes a comparator and a switched-capacitor DAC. The switched-capacitor DAC includes a capacitor and a driving circuit that is electrically connected to the capacitor. The driving circuit includes a P-type MOSFET and a N-type MOSFET, and a gate of the P-type MOSFET is not electrically connected to a gate of the N-type MOSFET. The control circuit includes a first memory, a second memory, a first buffer, and a second buffer. The first memory is coupled to the comparator and configured to store an output value of the comparator. The second memory is coupled to the comparator and configured to store the output value of the comparator. The first buffer, coupled between the first memory and the P-type MOSFET, has a first delay and is configured to generate a first control signal. The second buffer, coupled between the second memory and the N-type MOSFET, has a second delay and is configured to generate a second control signal. The P-type MOSFET is controlled by the first control signal, the N-type MOSFET is controlled by the second control signal, and the second delay is greater than the first delay.

The SAR ADC and its control circuit of the present invention can prevent the SAR ADC from generating a short-circuit current. Compared with the prior art, the SAR ADC of the present invention has low power consumption and does not cause ripples.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a successive approximation register analog-to-digital converter (SAR ADC) and a control circuit thereof. On account of that some or all elements of the SAR ADC could be known, the detail of such elements is omitted provided that such detail has little to do with the features of this disclosure and this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 1:
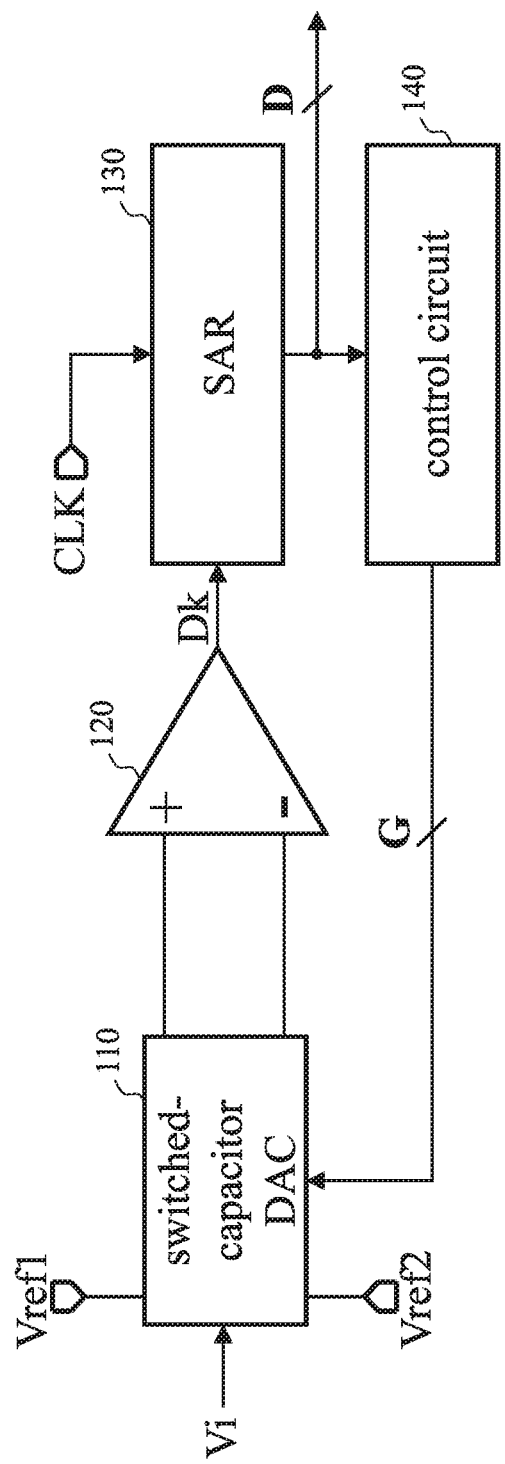
FIG. 1 is a functional block diagram of the conventional SAR ADC.
Figure 2:
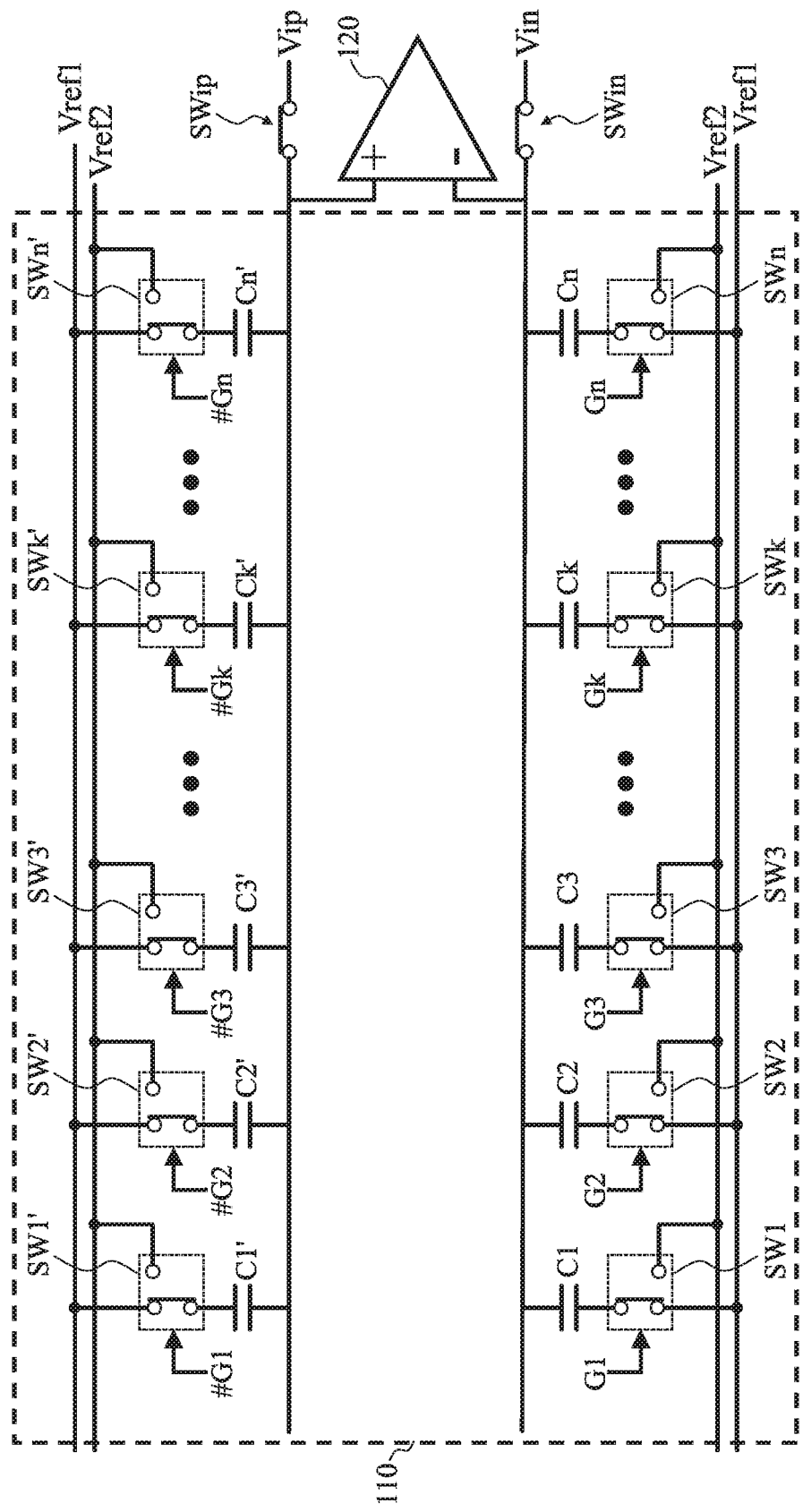
FIG. 2 shows an internal circuit of a switched-capacitor DAC.
Figure 3:
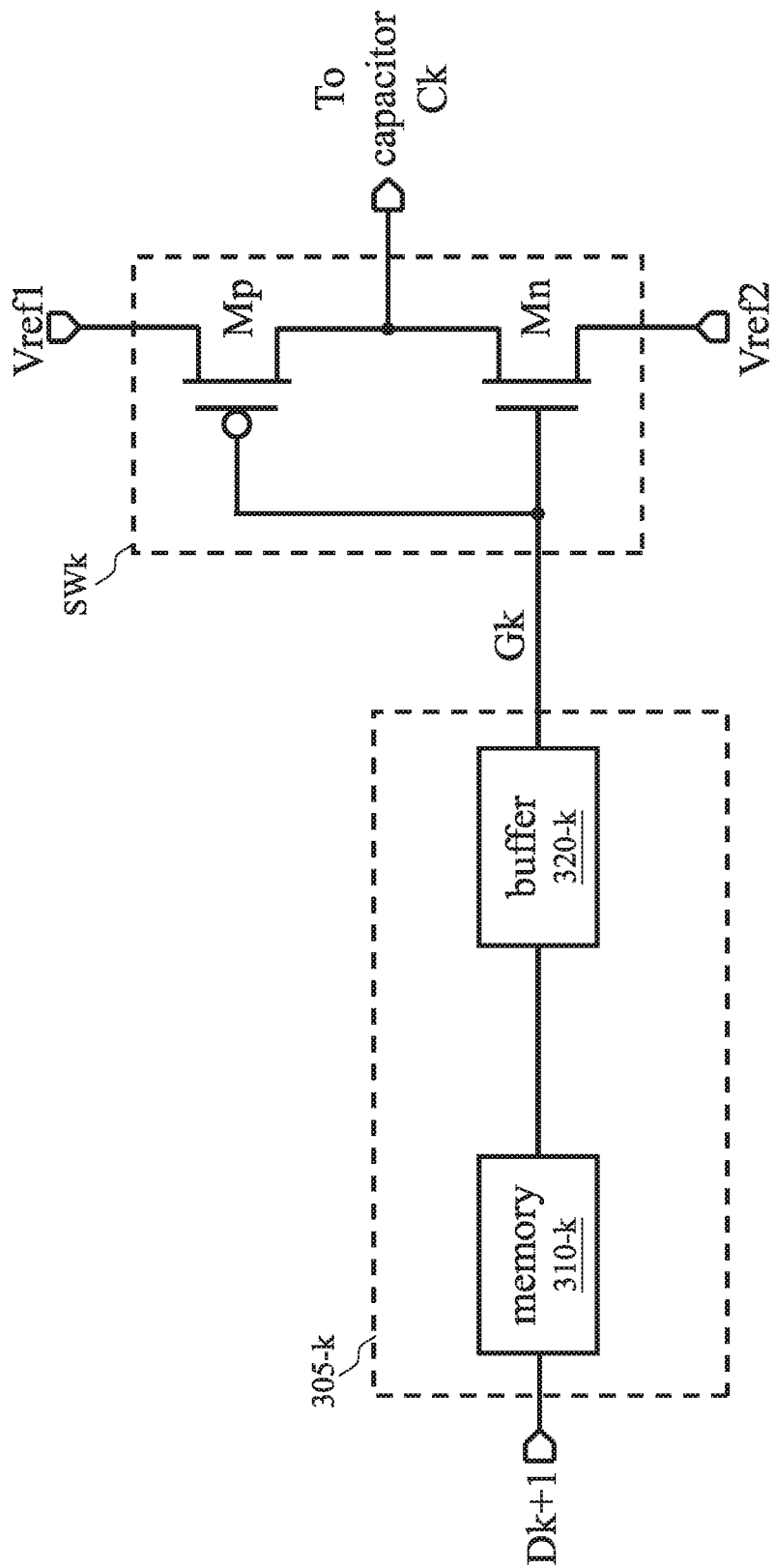
FIG. 3 shows the connections between the sub-control circuit and the switch.
Figure 4:
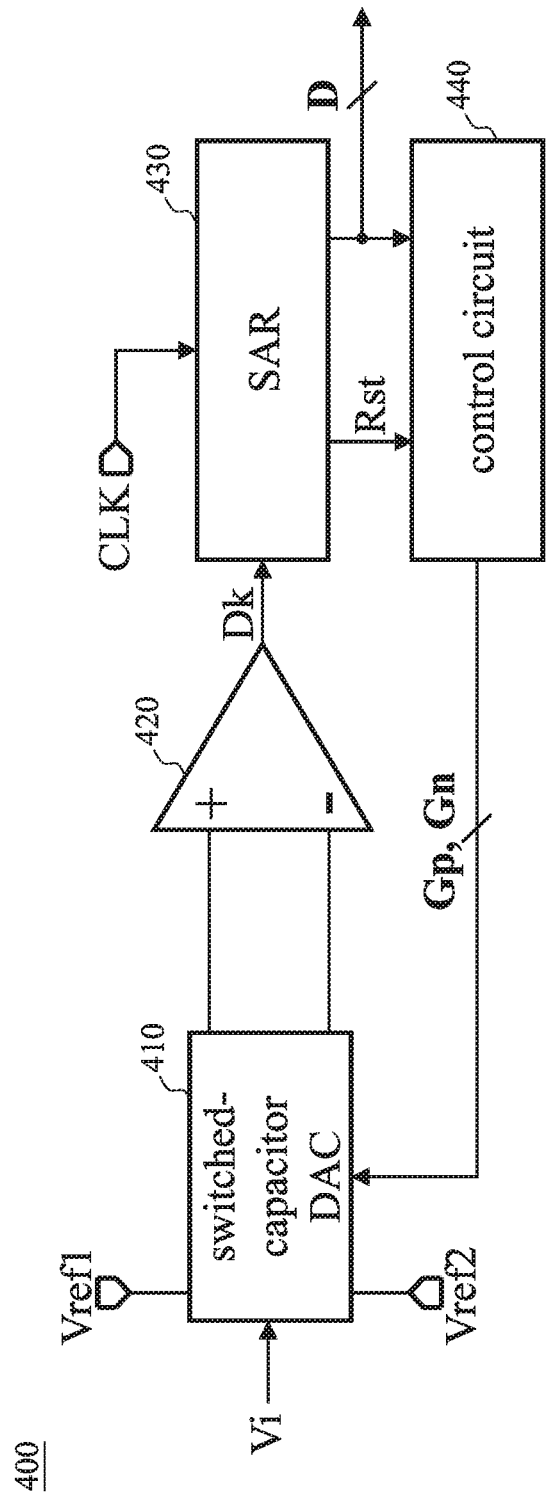
FIG. 4 is a functional block diagram of a SAR ADC according to an embodiment of the present invention.

FIG. 4 is a functional block diagram of a successive approximation register analog-to-digital converter (SAR ADC) 400 according to an embodiment of the present invention. The SAR ADC 400 includes a switched-capacitor digital-to-analog converter (DAC) 410, a comparator 420, a successive approximation register (SAR) 430, and a control circuit 440. The SAR ADC 400 operates according to the clock CLK to convert the analog input signal Vi into a digital signal (i.e., the digital code D). In a certain operation of the SAR ADC 400, the SAR 430 determines the value (1/0) of one bit of the digital code D according to the comparison result of the comparator 420, and outputs the reset signal Rst or changes the voltage level of the reset signal Rst after all bits of the digital code D are determined. The control circuit 440 generates the control signals Gp and Gn based on the digital code D or the reset signal Rst. The control signals Gp and Gn control the terminal voltage of the capacitors of the switched-capacitor DAC 410 (i.e., control the bottom plate of the capacitor to be coupled to the reference voltage Vref1 or the reference voltage Vref2) to cause the charges on the capacitors to redistribute, which in turn changes the voltages that the comparator 420 compares in the subsequent comparison operation. The above steps are repeated so that the digit code D is determined bit by bit from the most significant bit (MSB) to the least significant bit (LSB) while the value that the digital code D represents gradually approaches the input signal Vi.

Figure 5:
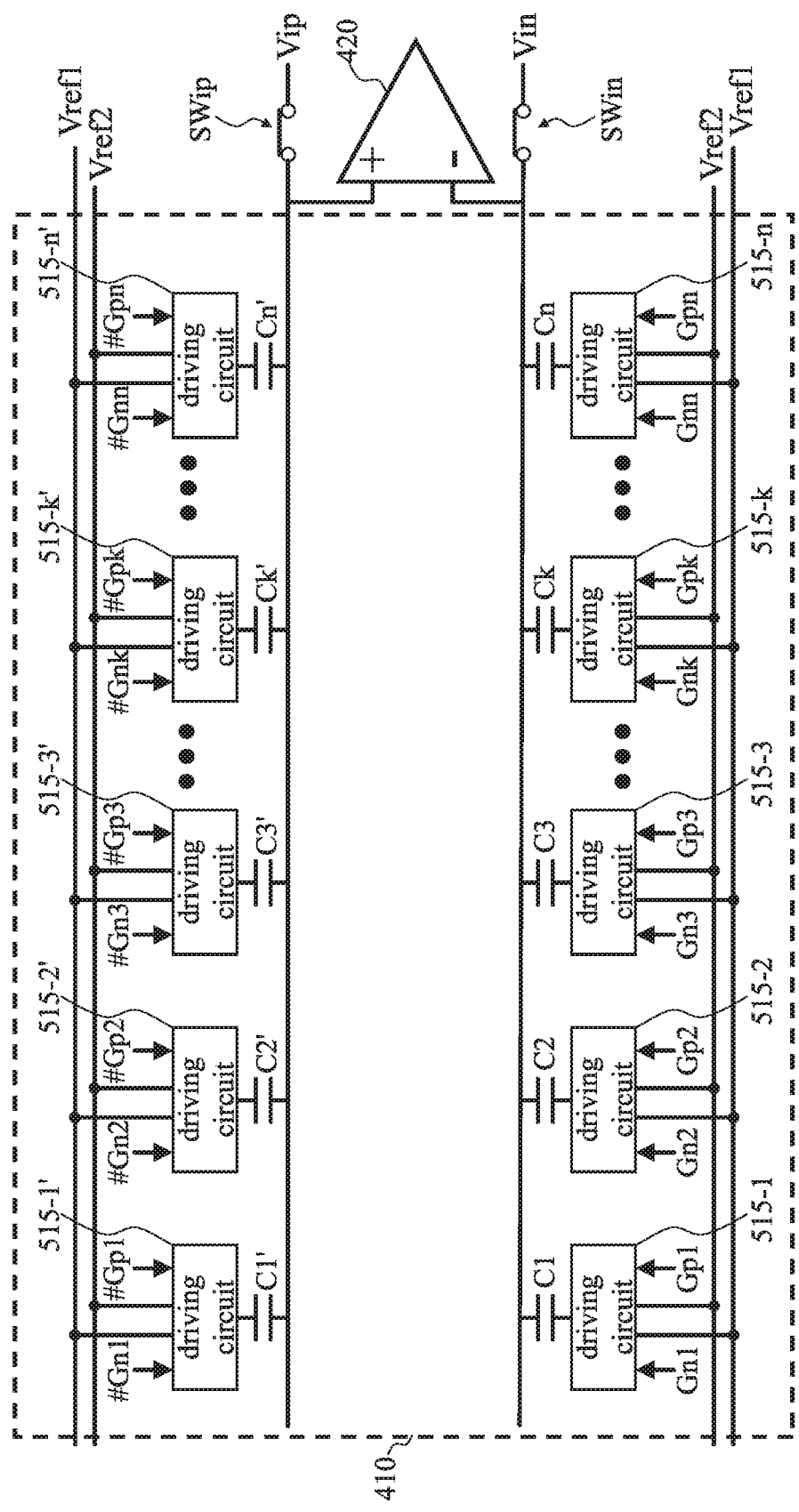
FIG. 5 shows an internal circuit of a switched-capacitor DAC.

FIG. 5 shows an internal circuit of a switched-capacitor DAC 410. The switched-capacitor DAC 410 includes two capacitor arrays, each including n capacitors (C1 to Cn or C1' to Cn') and n driving circuits (515-1 to 515-n or 515-1' to 515-n') (n is a positive integer). The control signal Gp includes n sub-control signals Gp1 to Gpn and n sub-control signals #Gp1 to #Gpn, and the control signal Gn includes n sub-control signals Gn1 to Gnn and n sub-control signals #Gn1 to #Gnn. The sub-control signals Gp1 to Gpn (or #Gp1 to #Gpn) correspond to the bits D2 to Dn+1, respectively, and the sub-control signals Gn1 to Gnn (or #Gn1 to #Gnn) correspond to the bits D2 to Dn+1, respectively. The sub-control signal #Gpk is an inverted signal of the sub-control signal Gpk, and the sub-control signal #Gnk is an inverted signal of the sub-control signal Gnk. The driving circuit 515-*k* and the driving circuit 515-*k* are respectively controlled by the sub-control signal pair (Gpk, Gnk) and the sub-control signal pair (#Gpk, #Gnk) (k is an integer and 1≤k≤n). More specifically, when the driving circuit 515-*k* provides the reference voltage Vref1 to the capacitor Ck, the driving circuit 515-*k*′ provides the reference voltage Vref2 to the capacitor Ck′; when the driving circuit 515-*k* provides the reference voltage Vref2 to the capacitor Ck, the driving circuit 515-*k*′ provides the reference voltage Vref1 to the capacitor Ck′. FIG. 5 also shows that the input signal Vi is a differential signal, which is made up of the signals Vip and Vin, and the switch SWip and the switch SWin are utilized to sample the input signal Vi.

Figure 6:
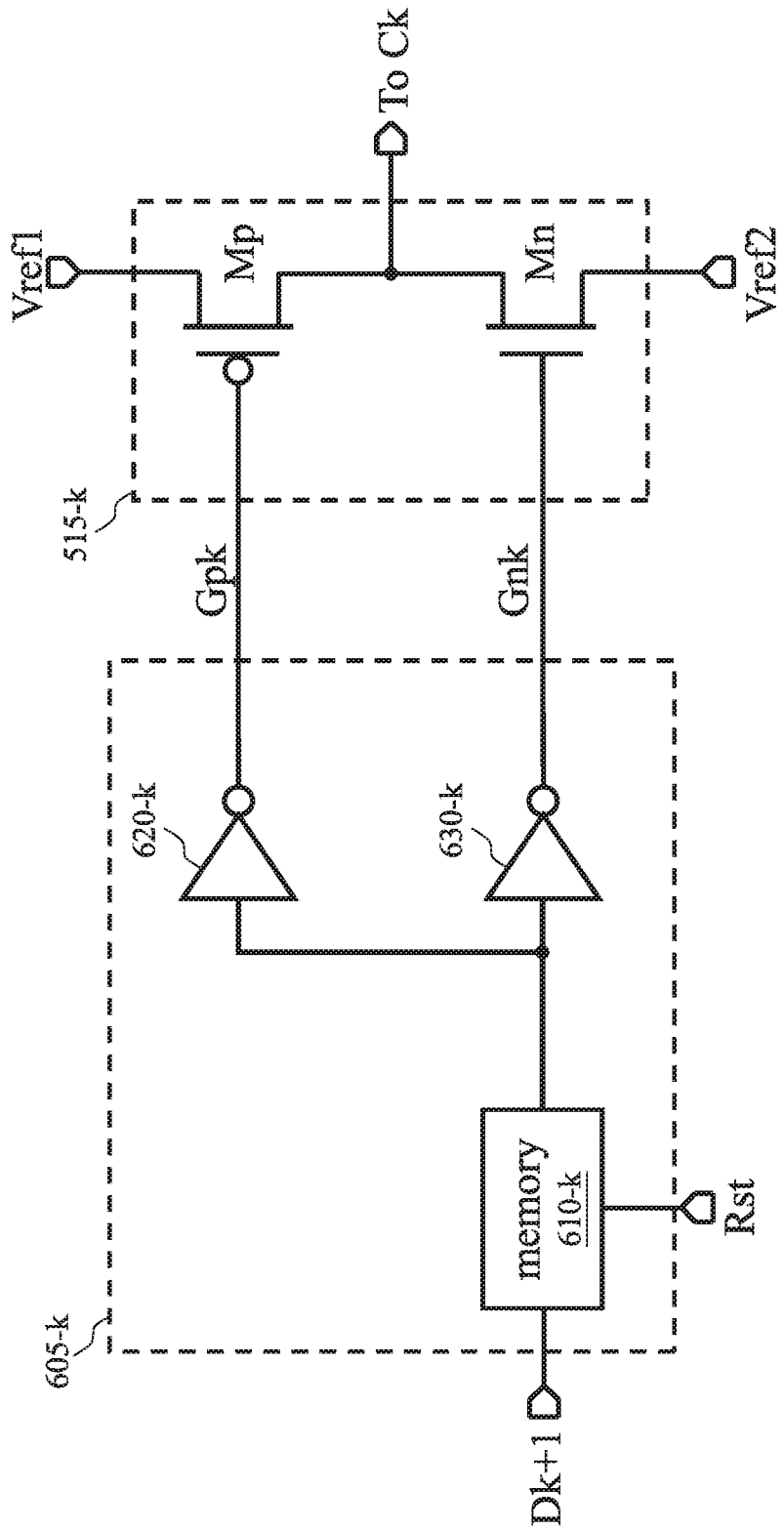
FIG. 6 shows connections between a sub-control circuit and a driving circuit according to an embodiment of the present invention.

The control circuit 440 includes n sub-control circuits, and the n sub-control circuits respectively correspond to the driving circuits 515-1 to 515-*n*, namely, corresponding to the capacitors C1 to Cn, respectively. FIG. 6 shows connections between the sub-control circuit 605-*k* and the driving circuit 515-*k*. The driving circuit 515-*k* includes the P-type MOSFET Mp and the N-type MOSFET Mn. The gate of the P-type MOSFET Mp receives the sub-control signal Gpk, the source of the P-type MOSFET Mp receives the reference voltage Vref1, and the drain of the P-type MOSFET Mp is electrically connected to the bottom plate of the capacitor Ck. The top plate of the capacitor Ck is electrically connected to the comparator 420. The gate of the N-type MOSFET Mn receives the sub-control signal Gnk, the source of the N-type MOSFET Mn receives the reference voltage Vref2, and the drain of the N-type MOSFET Mn is electrically connected to the drain of the P-type MOSFET Mp and the bottom plate of the capacitor Ck. The reference voltage Vref1 is greater than the reference voltage Vref2. The gate of the P-type MOSFET Mp is not electrically connected to the gate of the N-type MOSFET Mn.

The sub-control circuit 605-*k* includes a memory 610-*k*, an inverter 620-*k*, and an inverter 630-*k*. The memory 610-*k* stores the output value of the comparator 420 (i.e., bit Dk+1). The bit Dk+1 in the figure may be the output of the comparator 420 or the register value of the SAR 430. The inverter 620-*k* is coupled between the memory 610-*k* and the P-type MOSFET Mp and configured to invert the value stored in the memory 610-*k* (i.e., bit Dk+1) to generate the sub-control signal Gpk. The inverter 630-*k* is coupled between the memory 610-*k* and the N-type MOSFET Mn and configured to invert the value stored in the memory 610-*k* (i.e., bit Dk+1) to generate the sub-control signal Gnk. The memory 610-*k* is reset according to the reset signal Rst.

Figure 7:
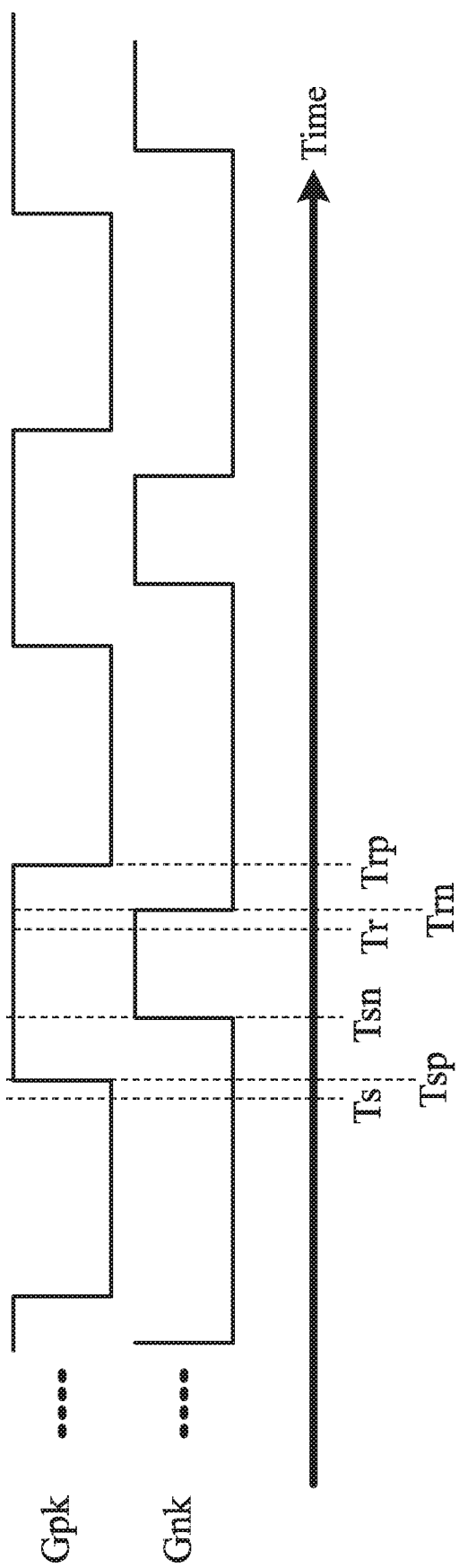
FIG. 7 shows waveforms of the sub-control signal Gpk and the sub-control signal Gnk.

FIG. 7 shows waveforms of the sub-control signal Gpk and the sub-control signal Gnk. When the sub-control signal Gpk is at a low voltage level, the sub-control signal Gnk is not at a high voltage level, and when the sub-control signal Gnk is at the high voltage level, the sub-control signal Gpk is not at the low voltage level. In other words, the P-type MOSFET Mp and the N-type MOSFET Mn of the driving circuit 515-*k* are not turned on at the same time. When the driving circuit 515-*k* is about to switch from the state where the P-type MOSFET Mp is turned on and the N-type MOSFET Mn is turned off to the state where the P-type MOSFET Mp is turned off and the N-type MOSFET Mn is turned on, the control circuit 440 first controls the P-type MOSFET Mp to turn off and then controls the N-type MOSFET Mn to turn on. When the driving circuit 515-*k* is about to switch from a state where the P-type MOSFET Mp is turned off and the N-type MOSFET Mn is turned on to a state where the P-type MOSFET Mp is turned on and the N-type MOSFET Mn is turned off, the control circuit 440 first controls the N-type MOSFET Mn to turn off and then controls the P-type MOSFET Mp to turn on. The waveforms of FIG. 7 are discussed below.

After the comparator 420 generates an output value (bit Dk+1) at the time point Ts (assuming here that the bit Dk+1 is a logic 0), the sub-control signal Gpk is switched from the low voltage level to the high voltage level at the time point Tsp, and the sub-control signal Gnk is switched from the low voltage level to the high voltage level at the time point Tsn. In other words, the rising edge of the sub-control signal Gpk leads the rising edge of the sub-control signal Gnk. The time interval between the time point Tsp and the time point Ts is the delay caused by the memory 610-*k* and/or the inverter 620-*k*. The time interval between the time point Tsn and the time point Ts is the delay caused by the memory 610-*k* and/or the inverter 630-*k*.

After the comparator 420 is reset by the reset signal Rst at the time point Tr (assuming here that the output value of the comparator 420 is reset to logic 1), the sub-control signal Gnk is switched from the high voltage level to the low voltage level at the time point Trn, and the sub-control signal Gpk is switched from the high voltage level to the low voltage level at the time point Trp. In other words, the falling edge of the sub-control signal Gnk leads the falling edge of the sub-control signal Gpk. The time interval between the time point Trn and the time point Tr is the delay caused by the memory 610-*k* and/or the inverter 630-*k*. The time interval between the time point Trp and the time point Tr is the delay caused by the memory 610-*k* and/or the inverter 620-*k*.

Figure 8:
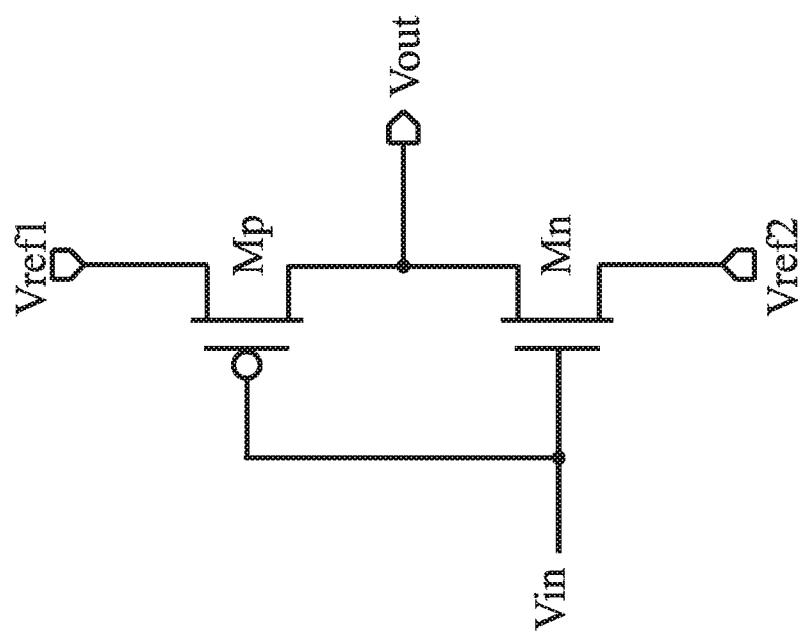
FIG. 8 is a circuit diagram of an inverter.

FIG. 8 is a circuit diagram of the inverter 620-*k* or the inverter 630-*k*. The inverter includes the P-type MOSFET Mp and the N-type MOSFET Mn that are connected in series. When the signal Vin is at a low voltage level (e.g., the reference voltage Vref2), the P-type MOSFET Mp is turned on and the N-type MOSFET Mn is turned off, and the output signal Vout is at a high voltage level (e.g., the reference voltage Vref1). When the signal Vin is at the high voltage level (e.g., the reference voltage Vref1), the P-type MOSFET Mp is turned off and the N-type MOSFET Mn is turned on, and the output signal Vout is at the low voltage level (e.g., the reference voltage Vref2). The P-type MOSFET Mp of the inverter 620-*k* has a first aspect ratio $(W/L)_1$, and the N-type MOSFET Mn of the inverter 620-*k* has a second aspect ratio $(W/L)_2$. The P-type MOSFET Mp of the inverter 630-*k* has a third aspect ratio $(W/L)_3$, and the N-type MOSFET Mn of the inverter 630-*k* has a fourth aspect ratio $(W/L)_4$. The inverter 620-*k* and the inverter 630-*k* can realize the waveforms of FIG. 7 according to the following design schemes: (1) $(W/L)_1 > (W/L)_2$; and/or (2) $(W/L)_3 < (W/L)_4$.

Figure 9:
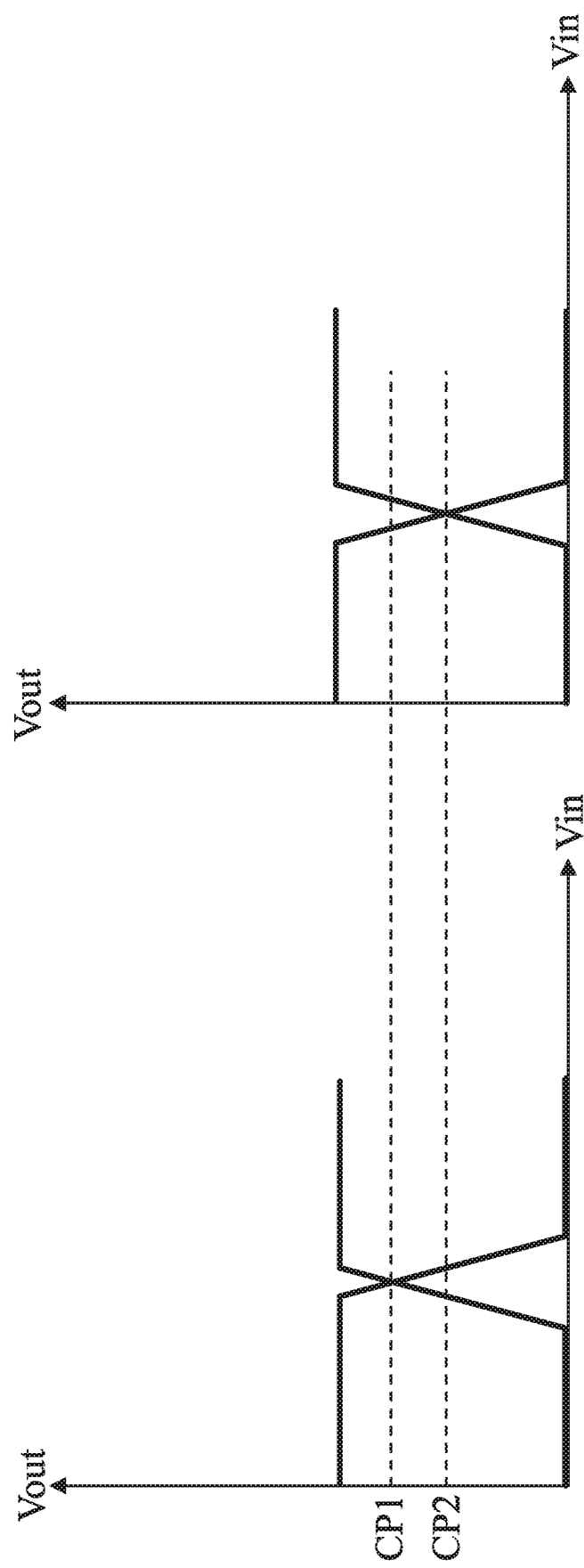
FIG. 9 shows crossing points of the inverters.

In the design scheme (1), $(W/L)_3$ may be equal to $(W/L)_4$. Since the driving capability or turn-on capability of the P-type MOSFET Mp of the inverter 620-*k* is greater than that of the N-type MOSFET Mn of the inverter 620-*k*, the inverter 620-*k* has a higher crossing point. FIG. 9 shows crossing points of the inverters. In FIG. 9, the diagram on the left corresponds to the inverter 620-*k* $((W/L)_1 > (W/L)_2)$, the diagram on the right corresponds to the inverter 630-*k* $((W/L)_3 \approx (W/L)_4)$, and the crossing point CP1 is higher than the crossing point CP2. In other words, in the design scheme (1), the crossing point of the inverter 620-*k* is higher than the crossing point of the inverter 630-*k*, so that the rising edge of the sub-control signal Gpk leads the rising edge of the sub-control signal Gnk, and the falling edge of the sub-control signal Gnk leads the falling edge of the sub-control signal Gpk.

In the design scheme (2), $(W/L)_1$ may be equal to $(W/L)_2$. Since the driving capability or turn-on capability of the N-type MOSFET Mn of the inverter 630-$k$ is greater than that of the P-type MOSFET Mp of the inverter 630-$k$, the inverter 630-$k$ has a lower crossing point. In other words, in the design scheme (2), the crossing point of the inverter 630-$k$ is lower than the crossing point of the inverter 620-$k$, so that the rising edge of the sub-control signal Gnk lags the rising edge of the sub-control signal Gpk, and the falling edge of the sub-control signal Gpk lags the falling edge of the sub-control signal Gnk.

The waveforms shown in FIG. 7 can be realized more easily by implementing the design schemes (1) and (2) at the same time.

Figure 10:
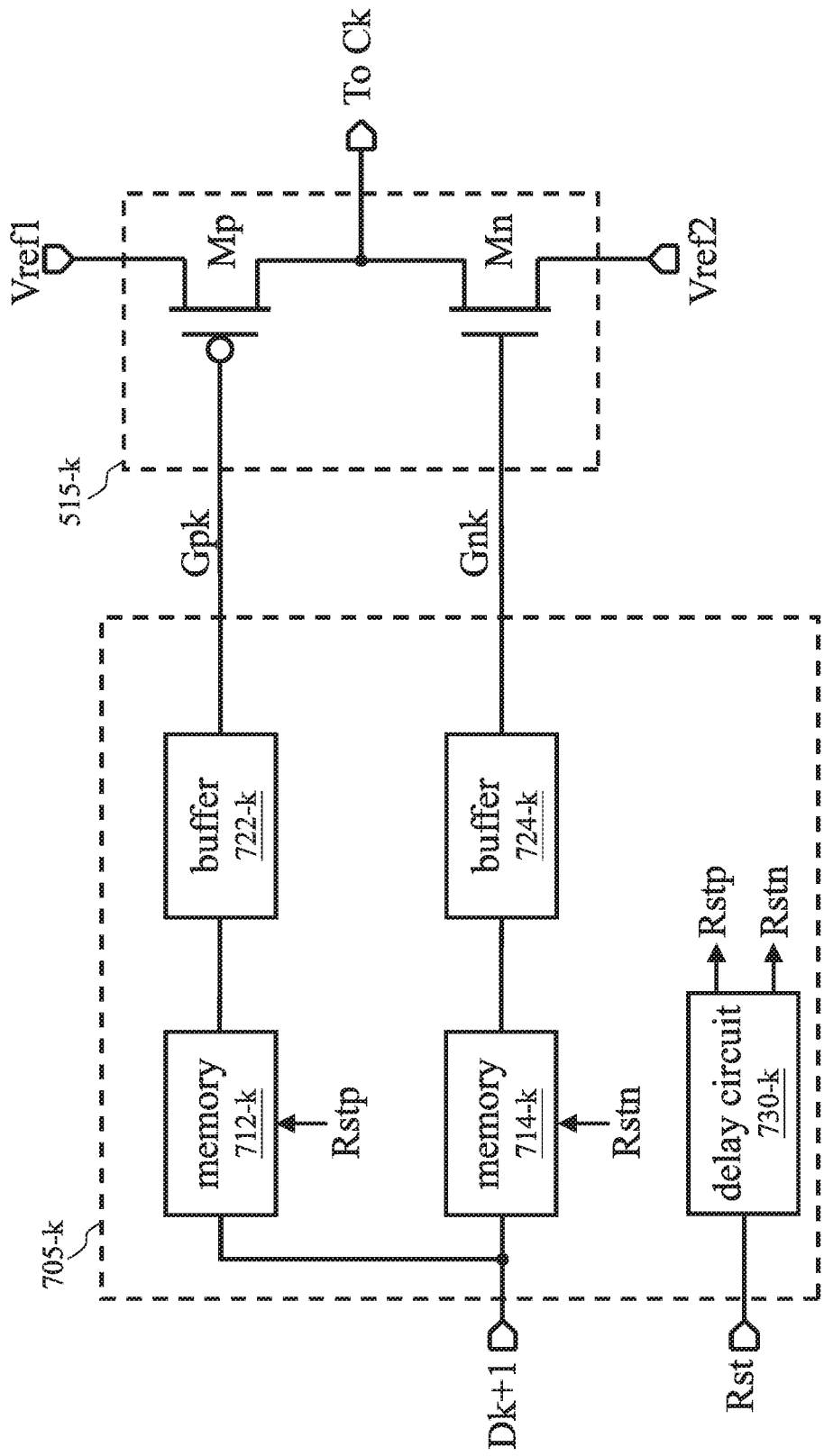
FIG. 10 shows connections between a sub-control circuit and a driving circuit according to another embodiment of the present invention.

FIG. 10 is a circuit diagram of a sub-control circuit according to another embodiment of the present invention. The sub-control circuit 705-$k$ includes a memory 712-$k$, a memory 714-$k$, a buffer 722-$k$, a buffer 724-$k$, and a delay circuit 730-$k$. The memory 712-$k$ and the memory 714-$k$ are coupled to the comparator 420 and configured to store the output value of the comparator 420 (bit Dk+1). The buffer 722-$k$ is coupled between the memory 712-$k$ and the P-type MOSFET Mp of the driving circuit 515-$k$. The buffer 724-$k$ is coupled between the memory 714-$k$ and the N-type MOSFET Mn of the driving circuit 515-$k$. The memory 712-$k$ and the memory 714-$k$ are reset according to the reset signal Rstp and the reset signal Rstn, respectively. The delay circuit 730-$k$ generates the reset signal Rstp and the reset signal Rstn according to the reset signal Rst.

The buffer 722-$k$ and the buffer 724-$k$ respectively generate the sub-control signal Gpk and the sub-control signal Gnk according to the value stored in the memory 712-$k$ and the memory 714-$k$ (i.e., bit Dk+1). The buffer 722-$k$ includes an inverter or a plurality of inverters connected in series; the buffer 724-$k$ includes an inverter or a plurality of inverters connected in series. In this embodiment, the delay caused or generated by the buffer 724-$k$ is greater than the delay caused or generated by the buffer 722-$k$. The delays of the buffer 722-$k$ and the buffer 724-$k$ can be adjusted by altering the number of inverters. In other words, in this embodiment, the number of inverters of the buffer 724-$k$ is greater than the number of inverters of the buffer 722-$k$. The number of inverters of the buffer 722-$k$ and the number of inverters of the buffer 724-$k$ are both even or odd numbers. By adjusting the number of inverters of the buffer 722-$k$ and the number of inverters of the buffer 724-$k$, this embodiment can realize the design purpose that the rising edge of the sub-control signal Gpk leads the rising edge of the sub-control signal Gnk.

The delay circuit 730-$k$ causes the reset signal Rstn to lead the reset signal Rstp, so that the memory 714-$k$ is reset earlier than the memory 712-$k$; as a result, the falling edge of the sub-control signal Gnk leads the falling edge of the sub-control signal Gpk. If the reset signal Rstn leads the reset signal Rstp by a time length T, the time length T should be greater than the difference between the delay of the buffer 724-$k$ and the delay of the buffer 722-$k$. The delay circuit 730-$k$ can be implemented by a plurality of inverters connected in series.

The aforementioned memories 610-$k$, 712-$k$, 714-$k$ may be a latch, a flip-flop (e.g., D flip-flop), a register, or a circuit capable of storing data.

Since a person having ordinary skill in the art can appreciate the implementation detail and the modification thereto of the present method invention through the disclosure of the device invention, repeated and redundant description is thus omitted. Furthermore, the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A successive approximation register analog-to-digital converter (SAR ADC) comprising a comparator, a switched-capacitor digital-to-analog converter (DAC) and a control circuit, the switched-capacitor DAC comprising a capacitor and a driving circuit that is electrically connected to the capacitor, the driving circuit comprising:
    a P-type MOSFET having a first gate, a first source, and a first drain, wherein the first gate receives a first control signal, the first source receives a first a reference voltage, and the first drain is electrically connected to a first end of the capacitor of the switched-capacitor DAC, a second end of the capacitor being coupled to an input end of the comparator; and
    an N-type MOSFET having a second gate, a second source, and a second drain, wherein the second gate receives a second control signal, the second source receives a second reference voltage, and the second drain is electrically connected to the first end of the capacitor;
    wherein the control circuit controls a target voltage of the first end of the capacitor according to an output value of the comparator, and the control circuit controls the target voltage to change from a high voltage level to a low voltage level by controlling a rising edge of the first control signal to lead a rising edge of the second control signal, or the control circuit controls the target voltage to change from the low voltage level to the high voltage level by controlling the falling edge of the second control signal to lead the falling edge of the first control signal.

2. The SAR ADC of claim 1, wherein the P-type MOSFET is a first P-type MOSFET, and the N-type MOSFET is a first N-type MOSFET, the control circuit comprising:
    a memory configured to store the output value of the comparator;
    a first inverter, coupled between the memory and the first P-type MOSFET and configured to generate the first control signal, comprising:
        a second P-type MOSFET having a first aspect ratio; and
        a second N-type MOSFET having a second aspect ratio; and
    a second inverter, coupled between the memory and the first N-type MOSFET and configured to generate the second control signal, comprising:
        a third P-type MOSFET having a third aspect ratio; and
        a third N-type MOSFET having a fourth aspect ratio;
    wherein the first aspect ratio is greater than the second aspect ratio and/or the third aspect ratio is smaller than the fourth aspect ratio.

3. The SAR ADC of claim 1, wherein the control circuit comprises:
    a first memory coupled to the comparator and configured to store the output value of the comparator;

a second memory coupled to the comparator and configured to store the output value of the comparator;
a first buffer coupled between the first memory and the P-type MOSFET and configured to improve the driving capability of the first control signal and to generate a first delay; and
a second buffer coupled between the second memory and the N-type MOSFET and configured to improve the driving capability of the second control signal and to generate a second delay;
wherein the second delay is greater than the first delay.

4. The SAR ADC of claim 3, wherein the SAR ADC generates a digital code, the control circuit further comprising:
a delay circuit coupled to the first memory and the second memory and configured to generate a first memory reset signal and a second memory reset signal according to a memory reset signal;
wherein the SAR ADC generates the memory reset signal after generating the digital code, the first memory reset signal is utilized to reset the first memory, the second memory reset signal is utilized to reset the second memory, and the second memory reset signal leads the first memory reset signal.

5. A control circuit of a successive approximation register analog-to-digital converter (SAR ADC) comprising a comparator and a switched-capacitor digital-to-analog converter (DAC), the switched-capacitor DAC comprising a capacitor and a driving circuit that is electrically connected to the capacitor, the driving circuit comprising a first P-type MOSFET and a first N-type MOSFET, and a gate of the first P-type MOSFET being not electrically connected to a gate of the first N-type MOSFET, the control circuit comprising:
a memory configured to store an output value of the comparator;
a first inverter, coupled between the memory and the first P-type MOSFET and configured to generate a first control signal for controlling the first P-type MOSFET, comprising:
a second P-type MOSFET having a first aspect ratio; and
a second N-type MOSFET having a second aspect ratio; and a second inverter, coupled between the memory and the first N-type MOSFET and configured to generate a second control signal for controlling the first N-type MOSFET, comprising:
a third P-type MOSFET having a third aspect ratio; and
a third N-type MOSFET having a fourth aspect ratio;
wherein the first aspect ratio is greater than the second aspect ratio and/or the third aspect ratio is smaller than the fourth aspect ratio.

6. A control circuit of a successive approximation register analog-to-digital converter (SAR ADC) comprising a comparator and a switched-capacitor digital-to-analog converter (DAC), the switched-capacitor DAC comprising a capacitor and a driving circuit that is electrically connected to the capacitor, the driving circuit comprising a P-type MOSFET and a N-type MOSFET, and a gate of the P-type MOSFET being not electrically connected to a gate of the N-type MOSFET, the control circuit comprising:
a first memory coupled to the comparator and configured to store an output value of the comparator;
a second memory coupled to the comparator and configured to store the output value of the comparator;
a first buffer having a first delay, coupled between the first memory and the P-type MOSFET, and configured to generate a first control signal; and
a second buffer having a second delay, coupled between the second memory and the N-type MOSFET, and configured to generate a second control signal;
wherein the P-type MOSFET is controlled by the first control signal, the N-type MOSFET is controlled by the second control signal, and the second delay is greater than the first delay.

7. The control circuit of claim 6, wherein the SAR ADC generates a digital code, the control circuit further comprising:
a delay circuit coupled to the first memory and the second memory and configured to generate a first memory reset signal and a second memory reset signal according to a memory reset signal;
wherein the SAR ADC generates the memory reset signal after generating the digital code, the first memory reset signal is utilized to reset the first memory, the second memory reset signal is utilized to reset the second memory, and the second memory reset signal leads the first memory reset signal.

* * * * *